United States Patent [19]

Hunsinger et al.

[11] 4,162,466
[45] Jul. 24, 1979

[54] SURFACE ACOUSTIC WAVE RESONATOR

[75] Inventors: Bill J. Hunsinger, Mahomet; Roger D. Fildes, Urbana, both of Ill.

[73] Assignee: University of Illinois Foundation, Urbana, Ill.

[21] Appl. No.: 837,569

[22] Filed: Sep. 28, 1977

[51] Int. Cl.² .................. H03H 9/02; H03H 9/26; H03H 9/32; H03H 9/04
[52] U.S. Cl. .................................. 333/194; 333/195
[58] Field of Search .................. 333/30 R, 71, 72; 310/313; 331/107 A

[56] References Cited

U.S. PATENT DOCUMENTS 4,081,769  3/1978  Shreve ........................... 333/72

FOREIGN PATENT DOCUMENTS 1255292  12/1971  United Kingdom .................. 333/72

Primary Examiner—Alfred E. Smith
Assistant Examiner—Marvin Nussbaum
Attorney, Agent, or Firm—Martin Novack

[57] ABSTRACT

Applicants have discovered that the performance of Surface Acoustic Wave Resonators can be markedly improved by digressing from the accepted techniques of sensing standing waves set up by resonation in the SAW device. Applicants have developed a SAW resonator which employs one or more unidirectional transducers which are sensitive to traveling rather than standing waves. This construction obviates the deletevious action of direct, broad band, input to output coupling and avoids the high position sensitivity which occurs when bidirectional transducers are utilized to sense standing wave patterns.

7 Claims, 3 Drawing Figures

SURFACE ACOUSTIC WAVE RESONATOR

BACKGROUND OF THE INVENTION

This invention relates to Surface Acoustic Wave (SAW) devices and more particularly to a SAW device configured as a resonator.

SAW resonators have potential features of high frequency fundamental mode operation, high Q, small size and rugged and inexpensive construction. Their usage is however, limited due to several difficulties. First, present SAW resonators have limited selectivity due to the direct transmission of input signals to the output. This is because know SAW resonators make use of bidirectional transducers for both the input and output ports.

The second difficulty arises from the fact that known SAW resonators rely upon bidirectional transducers to detect standing waves to produce the output signal. Since a standing wave is the algebraic combination of traveling waves which are moving in opposite directions, and has relatively stationary maxima and minima, it is vital to place the output transducer in a precise manner so as to enable the standing wave's maxima to be sensed. As a practical matter, the precise location of the standing wave maxima is very difficult to control to within a small fraction of a wavelength. Moreover changes in the standing wave due to aging, temperature variations etc. will cause a shift in the resonant frequency of the device. Finally bidirectional transducers, if mislocated, impair signal coupling to the desired mode of oscillation and may couple to other cavity modes which are undesired. In practice, therefore, it is extremely difficult to produce SAW resonators which exhibit satisfactory output characteristics.

It is therefore an object of this invention to provide a SAW resonator with input/output ports which are not position sensitive.

A further object of this invention is to provide a SAW resonator which substantially eliminates the direct feed of signals from input to output port and thereby enables increased selectivity.

SUMMARY OF THE INVENTION

In accordance with the above objects, a SAW resonator is provided with a pair of reflector means spaced apart by an integral number of half wavelengths at the resonator's center frequency. Positioned between such reflector means are input and output transducers, with the input transducer being responsive to an input signal to induce traveling acoustic waves in the resonator. The output transducer is of the unidirectional sensitivity type and is poled to be insensitive to direct feed acoustic waves from the input transducer. As unidirectional transducers are insensitive to standing waves, the output transducer detects the traveling waves which have been enhanced about the resonator's center frequency, and the output signal is optimized.

DESCRIPTION OF THE PREFERRED EMBODIMENTS

Figure 1:
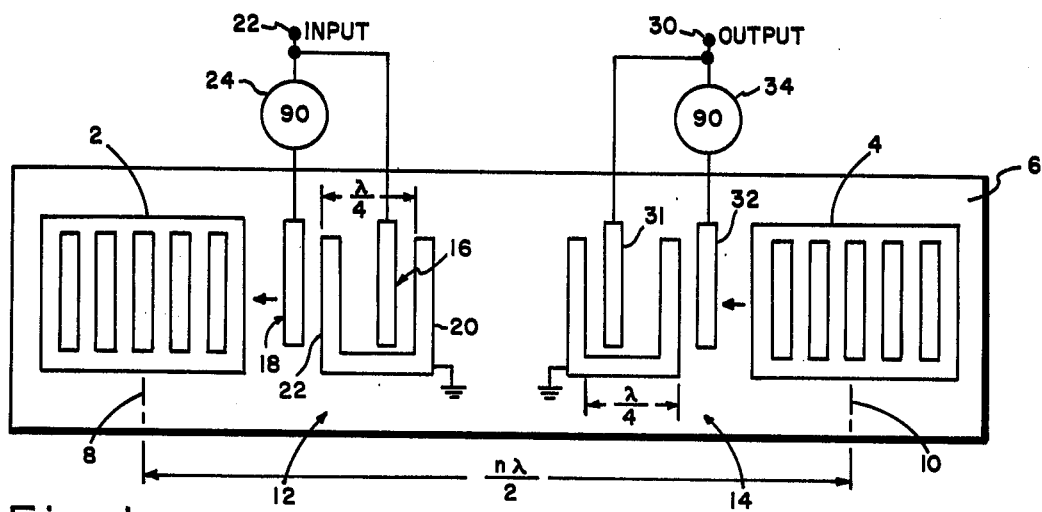
FIG. 1 is a schematic view of a preferred embodiment of the invention.

Referring now to FIG. 1, a plan view of SAW resonator is depicted which is not drawn to scale but which illustrates the invention. A pair of conductive reflection gratings 2 and 4 are positioned on a dielectric support 6 by well known photolithographic processes. Dielectric support may be quartz or any other material suitable for sustaining acoustic waves. Each of reflection gratings 2 and 4 have effective reflection planes 8 and 10 respectively which are spaced apart by an integral number of half wavelengths ($n\lambda/2$) where $\lambda$ is the wavelength of the center frequency ($f_o$) of the resonator.

Input and output unidirectional transducers 12 and 14 are positioned on dielectric support 6 in the acoustic propagation path between gratings 2 and 4. That transducers 12 and 14 may be arbitrarily located between gratings 2 and 4 will become apparent from the following discussion. Input transducer 12 comprises an in-phase finger 16 and quadrature finger 18 with their associated reference potential fingers 20 and 22. Fingers 16 and 18 are spaced an odd number of quarter wavelengths apart and are driven from signal applied to terminal 22, with the input to quadrature finger 18 being fed through 90° shifter 24.

To understand the operation of unidirectional transducer 12, assume the application of a periodic signal to terminal 22. The signal is applied to finger 16 and corresponding surface acoustic waves are induced in both the left and right directions. The left moving surface acoustic wave arrives at finger 18 after a quarter wavelength delay due to the propagation delay between fingers 16 and 18. At that instant, the same signal applied to finger 16 arrives at finger 18 after experiencing a quarter wavelength delay in delay circuit 24. As a result, finger 18 induces a surface acoustic wave which has both leftward and rightward propagating components. The leftward component is in phase and adds to the leftward propagating wave induced by finger 16 and the summation of both waves continue propagating in the leftward direction. The rightward propagating component generated by finger 18 arrives at finger 16 after a quarter wavelength delay. That delay added to the delay the signal experienced in phase shifter 24, puts it a half wavelength out of phase with (and subtractive from) the signal applied to finger 16. As a result cancellation occurs and little or no wave energy propagates to the right.

Unidirectional transducer 14 is identical to transducer 12, however it is employed as the output transducer. An analysis similar to the one above, demonstrates that a surface acoustic wave entering transducer from the left is never seen at output terminal 30. The signal induced on finger 31 is nulled by the signal passing through finger 32 and delay circuit 34 (delayed by a half wavelength). An acoustic wave entering from the right is sensed at output terminal 30 due to the additive reinforcement of the signals induced in fingers 32 and 31 respectively.

Turning now to the overall operation of the SAW resonator, the application of a periodic signal of wavelength $\lambda$ to input terminal 22 causes a surface acoustic wave to be propagated towards reflective grating 2. The induced surface wave is reflected in rightward direction and presses under transducers 12 and 14 to be reflected to the left by reflective grating 4. In addition to producing an output at terminal 30, the wave continues to propagate and, as will be hereinafter understood, arrives at transducer 12 in phase and additive to the input signal.

As aforestated, reflective gratings are positioned an integral number of half wavelengths apart. Thus it will be seen that an acoustic wave which propagates from input transducer 12 to grating 2; to grating 4 and back to transducer 12 has traveled $n\lambda$ and arrives in phase with the input signal. The in phase additions of such reflections with the input signal are completely independent of the positioning of transducer 12.

Figure 2:
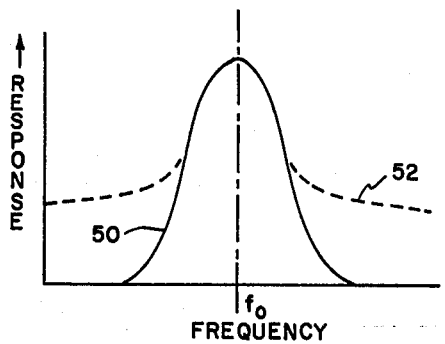
FIG. 2 is a graph comparing the response of a SAW resonator constructed according to the invention with one which is provided with bidirectional transducers.

The mutually reinforced surface acoustic waves continue propagating in the described manner, and as the signals continue to oscillate and reinforce each other at center frequency $f_o$ an output response is produced as shown by curve 50 in FIG. 2. Response curve 50 is indicative of the fact that all frequencies having wavelengths which substantially differ from $f_o$ are highly attenuated. Another feature of this resonator is apparent from an examination of curve 52, which is the response curve of a resonator employing only bidirectional transducers. The relatively flat portions of curve 52 are the result of the direct transmission of the entire frequency spectrum of input signals from the input to the output transducer. In the resonator shown in FIG. 1, there is no direct transmission of the broad band input signals to the output thereby greatly improving the device's selectivity.

Figure 3:
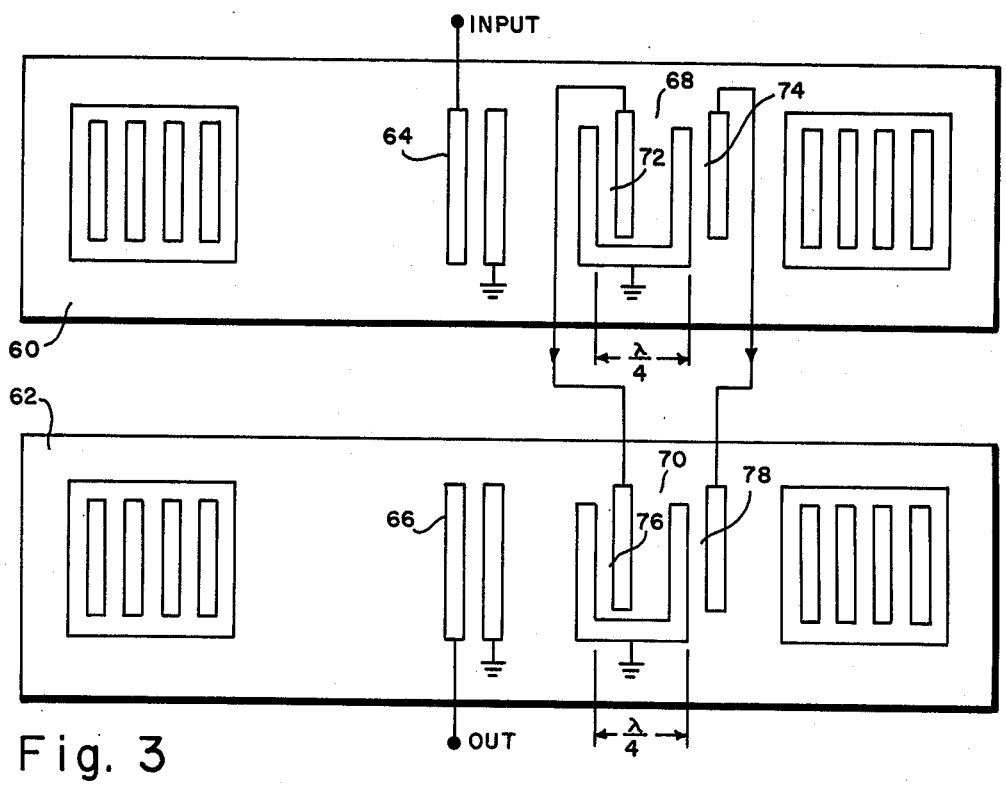
FIG. 3 is another embodiment of the invention.

Phase shift networks 24 and 34 may be strip lines or inductor circuits. In FIG. 3, the exterior phase shift circuits are replaced by another SAW resonator. Structurally, SAW resonators 60 and 62 are similar to that shown in FIG. 1, except that bidirectional transducers 64 and 66 are utilized as input and output ports respectively and unidirectional transducers 68 and 70 are employed to intercouple the SAW resonators.

In operation, an input signal applied to bidirectional transducer 64 induces an oscillatory surface wave condition in SAW resonator 60 at the center frequency $f_o$. As the signals induced in legs 72 and 74 of transducer 68 by the surface wave oscillation are a quarter wavelength out of phase, the signals applied as inputs to legs 76 and 78 of unidirectional transducer 70 have the requisite quadrature relationship. As a result, oscillations identical in type and frequency are set up in SAW resonator 62 with the unidirectional nature of transducer 70 preventing any direct feed to output transducer 66. In this instance both bidirectional transducers 64 and 66 should be located in the center of the SAW device. This is for the reason that at the center of the "cavity" of each SAW device, standing waves do not move with changes in frequency, temperature etc.

The invention has been described with reference to particular embodiments, but variations within the spirit and scope of the invention will occur to those skilled in the art. For example, while one variety of unidirectional transducer has been described, other unidirectional transducer structures which exhibit similar response characteristics may be substituted therefor.

We claim:

1. A surface acoustic wave resonator responsive to a frequency of wavelength $\lambda$ comprising dielectric support means having first and second reflector means spaced apart by an integral number of $\lambda/2$ wavelengths;
    unidirectional transducer means arranged between said reflector means and responsive to an input signal including said frequency, to induce a unidirectionally propagating, uniform beam; acoustic wave in said dielectric support means in the direction of said first reflector means; and
    output means positioned between said unidirectional transducer means and said second reflector means for sensing and providing output signals indicative of the oscillation of said surface waves between said reflector means.

2. The invention as defined in claim 1 wherein said output means is a unidirectional transducer oriented so as to sense only reflections coming from said second reflector means.

3. The invention as defined in claim 2 wherein said unidirectional transducers are comprised of two fingers spaced $\lambda/4$ apart and further including $\lambda/4$ delay means interconnected between said fingers.

4. The invention as defined in claim 1 further including;
    input means for applying said input signal to said unidirectional transducer means as two components, one component being delayed by $\lambda/4$ with respect to the other.

5. The invention as defined in claim 4 wherein said input means comprises a second surface acoustic wave resonator.

6. The invention as defined in claim 5 wherein said second acoustic wave resonator is provided with bidirectional input transducer means substantially centered on said resonator and an output transducer for providing orthogonally related input signal components.

7. The invention as defined in claim 6 wherein said output means is a bidirectional transducer.

* * * * *